US011122664B2

(12) United States Patent
Irizarry

(10) Patent No.: US 11,122,664 B2
(45) Date of Patent: Sep. 14, 2021

(54) FAULT SIGNAL RANGE EXTENDER

(71) Applicant: The United States of America, as represented by the Secretary of the Navy, Crane, IN (US)

(72) Inventor: George L Irizarry, Bloomington, IN (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 17/031,011

(22) Filed: Sep. 24, 2020

(65) Prior Publication Data

US 2021/0112644 A1 Apr. 15, 2021

Related U.S. Application Data

(60) Provisional application No. 62/904,808, filed on Sep. 24, 2019.

(51) Int. Cl.

| | |
|---|---|
| ***G01R 31/00*** | (2006.01) |
| ***G01R 31/14*** | (2006.01) |
| ***H05B 45/50*** | (2020.01) |
| ***H05B 45/37*** | (2020.01) |
| ***H05B 45/32*** | (2020.01) |

(52) U.S. Cl.
CPC ............. *H05B 45/50* (2020.01); *H05B 45/32* (2020.01); *H05B 45/37* (2020.01)

(58) Field of Classification Search
None
See application file for complete search history.

(56) References Cited

U.S. PATENT DOCUMENTS 6,172,862 B1 * 1/2001 Jonnatti ............... H02H 1/0015 340/647
10,095,193 B2 10/2018 Irizarry

FOREIGN PATENT DOCUMENTS

EP 0827249 A2 * 3/1998 ........... H02H 11/001

* cited by examiner

*Primary Examiner* — Dedei K Hammond
(74) *Attorney, Agent, or Firm* — Naval Surface Warfare Center, Crane Division; Eric VanWiltenburg

(57) ABSTRACT

Exemplary embodiments are directed towards safety systems associated with ultra-fast fault signal pulses to increase the fault signal pulses from milliseconds to seconds to energize external devices (e.g., LED lights). This is turn will alert the operators that the system is operational or a fault was detected. The fault signal width pulses are extended to drive or trigger external devices, such as external relays, which in turn completes a circuit to energize any external devices.

4 Claims, 3 Drawing Sheets

FAULT SIGNAL RANGE EXTENDER

CROSS-REFERENCE TO RELATED APPLICATIONS

The present application claims priority to U.S. Provisional Patent Application Ser. No. 62/904,808, filed Sep. 24, 2019, entitled "Fault Signal Range Extender," the disclosure of which is expressly incorporated by reference herein.

STATEMENT REGARDING FEDERALLY SPONSORED RESEARCH OR DEVELOPMENT

The invention described herein may be manufactured, used and licensed by or for the United States Government for any governmental purpose without payment of any royalties thereon. This invention (Navy Case 200,618) is assigned to the United States Government and is available for licensing for commercial purposes. Licensing and technical inquiries may be directed to the Technology Transfer Office, Naval Surface Warfare Center Crane, email: Cran_CTO@navy.mil.

FIELD OF THE INVENTION

The present invention relates to safety devices for notifying operators of a device fault.

BACKGROUND AND SUMMARY OF THE INVENTION

The present invention relates to a system for alerting an operator when a device is operational or if the device detected a fault. In electronic devices, a fault condition may only exist for a short period of time (e.g., milliseconds). Even though the fault is short, an operator needs to know that a fault has occurred because the underlying condition may be recurring or a sign of imminent device failure. However, system fault signal pulses are usually milliseconds long which are too short to trigger external devices, so operators may never become aware that a problem is forming.

According to an illustrative embodiment of the present disclosure, a fault signal range extender is used to allow short fault times to be detected and understood by an operator. Exemplary embodiments are directed towards safety systems associated with ultra-fast fault signal pulses. The main advantage of increasing the fault signal pulses from milliseconds to seconds is to energize external devices (e.g., LED lights). This is turn will alert the operators that the system is operational or a fault was detected. The fault signal width pulses are extended to drive or trigger external devices, such as external relays, which in turn completes a circuit to energize any external devices. The operators are alerted with external devices such as LED light indicators. If the system is operational the green LED will be energized; if any faults are detected, the green LED will turn off and a red LED will energize. If solid-state relays are used, the solid-state relays will alternate between on and off states. This is due to the fault signal pulses' 50% duty cycle. One pulse cycle is high 50% then low 50%, oscillating the solid-state relays, in ms intervals.

Additional features and advantages of the present invention will become apparent to those skilled in the art upon consideration of the following detailed description of the illustrative embodiment exemplifying the best mode of carrying out the invention as presently perceived.

BRIEF DESCRIPTION OF THE DRAWINGS

The detailed description of the drawings particularly refers to the accompanying figures in which.

DETAILED DESCRIPTION OF THE DRAWINGS

The embodiments of the invention described herein are not intended to be exhaustive or to limit the invention to precise forms disclosed. Rather, the embodiments selected for description have been chosen to enable one skilled in the art to practice the invention.

Figure 1:
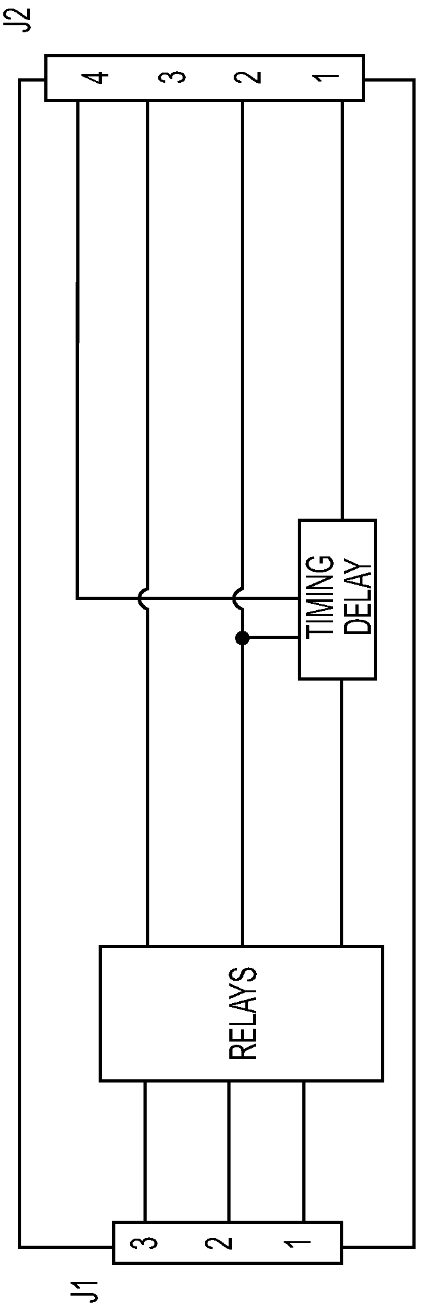
FIG. 1 shows a diagram of a basic timing delay system.

FIG. 1 shows a diagram of a basic timing delay system. First and second external connectors J1, J2 are coupled to optically isolated relays (e.g., solid state relays) and a timing delay circuit.

Figure 2:
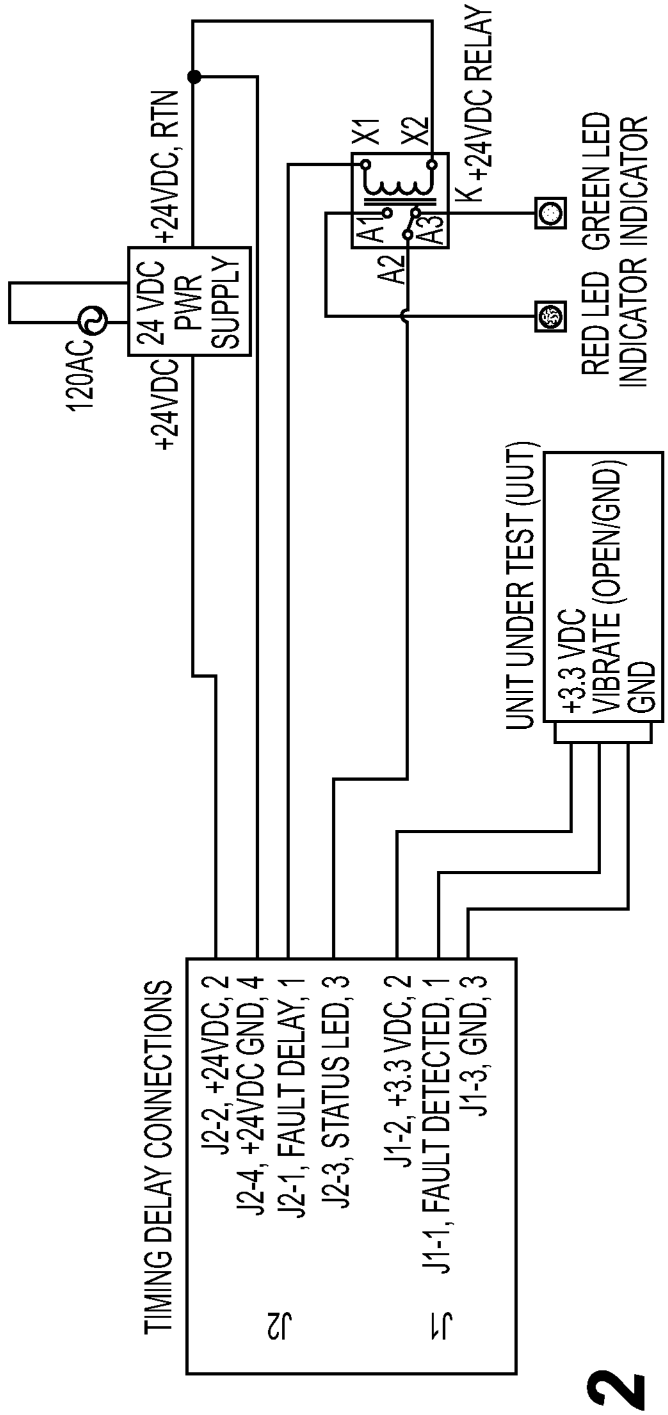
FIG. 2 shows a diagram of exemplary external devices.

FIG. 2 shows a diagram of exemplary external devices. The first connector can be coupled to a Unit Under Test (UUT) that produces the fault signals. An open/ground terminal of the UUT can be from an open collector circuit that is capable of sinking 2-3.3 Vdc at 100 mA, or from dry contact connections. The second connector can be coupled to a 24 Vdc power supply, a DC relay, and LED lights. One of the LED lights (e.g., a green light) will automatically turn on when the UUT is on.

Figure 3:
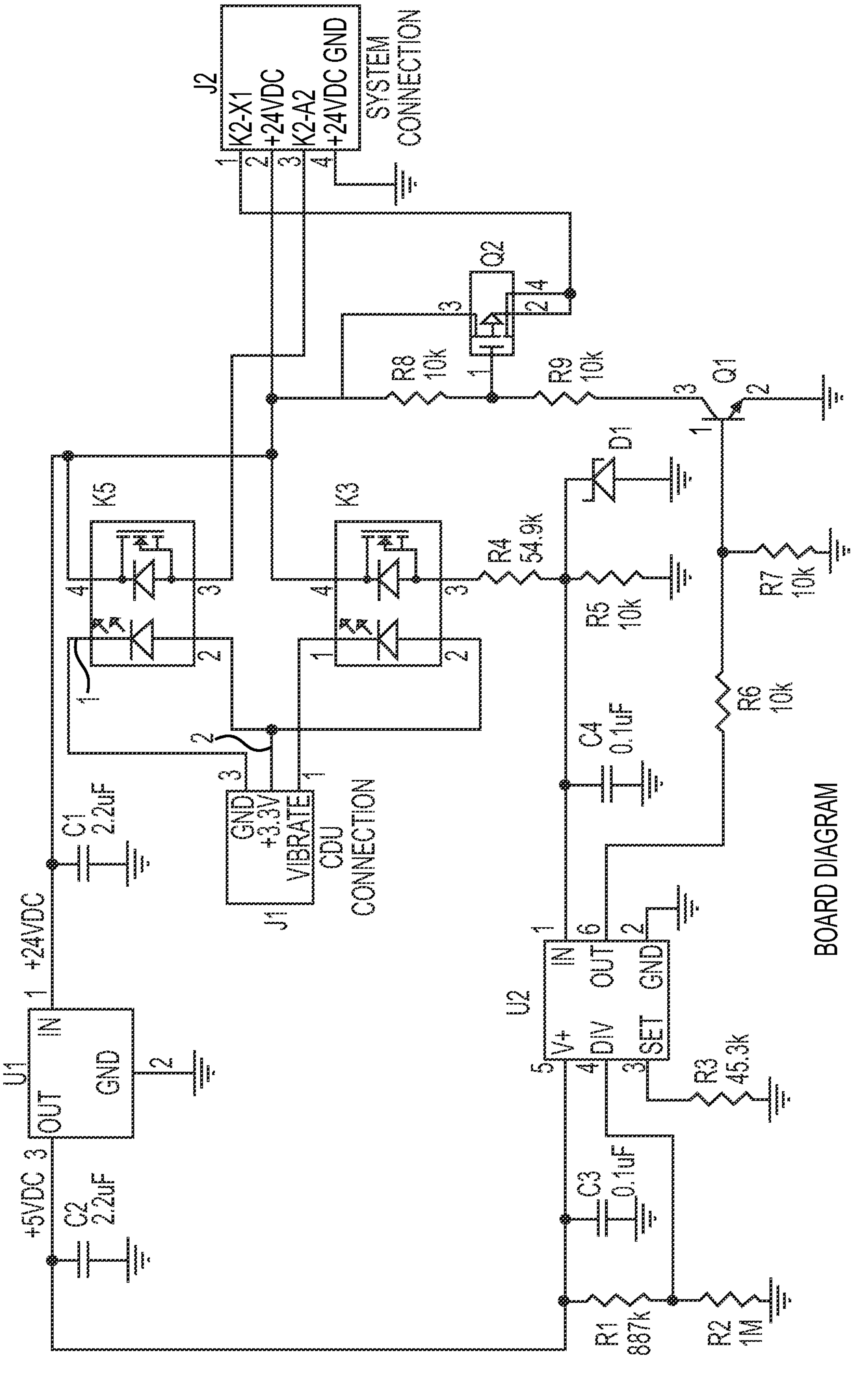
FIG. 3 shows a diagram for the timing delay circuit.

FIG. 3 shows a diagram for the timing delay circuit. When activated, relay K5 passes the 24 Vdc to J2-3, which is connect to external DC relay K-A2, such that the green LED is energized. If UUT detects fault signals, J1-1 will switch from an open circuit to ground, with the fault signals being on the millisecond time scale, to complete the circuit and energize K3. Solid state relays K3 and K5 can respond to fault signals with a pulse width of typically five nanoseconds. The output of relay K3 will have the same pulse width as the fault signals, but its amplitude changes from 3.3 Vdc to 24 Vdc. The input terminal for delay extender U2-1 is filtered/protected with a voltage divider (e.g., R4 and R5), a capacitor (e.g., C4), and a diode (e.g., D1) to suppress noise and ripples from the output voltage of relay K3-3. The voltage divider reduces the 24 Vdc to approximately 3.7 volts to protect delay extender U2, which has a maximum input of about 5 Vdc. The diode can be used as a voltage stabilizer to protect the circuits from overvoltage. R1 and R2 determine the stay-on delay range between 1 ms and 33 s ($t_{on\text{-}delay}$). R3 determines the $t_{on\text{-}delay}$ within the delay range. $t_{on\text{-}delay}$ starts at the falling edge transition of the fault signal detection.

In FIG. 3, $t_{on\text{-}delay}$ is approximately 10-12 seconds at U2 pin 6, output. The delay signal from output U2 pin 6 will turn on Q1, which turns on Q2, thus passing 24 Vdc from Q2 pins 2 and 4 to J2-1 and energizing the external relay and switching the relay contact from A2-A3 to A2-A1. This switch the current from the green LED to the red LED, indicating a fault was detected. The energized red LED will last approximately 10-12 seconds. If another fault signal is detected before the end of the delay signal, the timer starts over again. If no fault signals are detected during the 10-12 seconds, the relay contact switches to the original position (i.e., red LED turns off and the green LED turns on).

Figure 4:
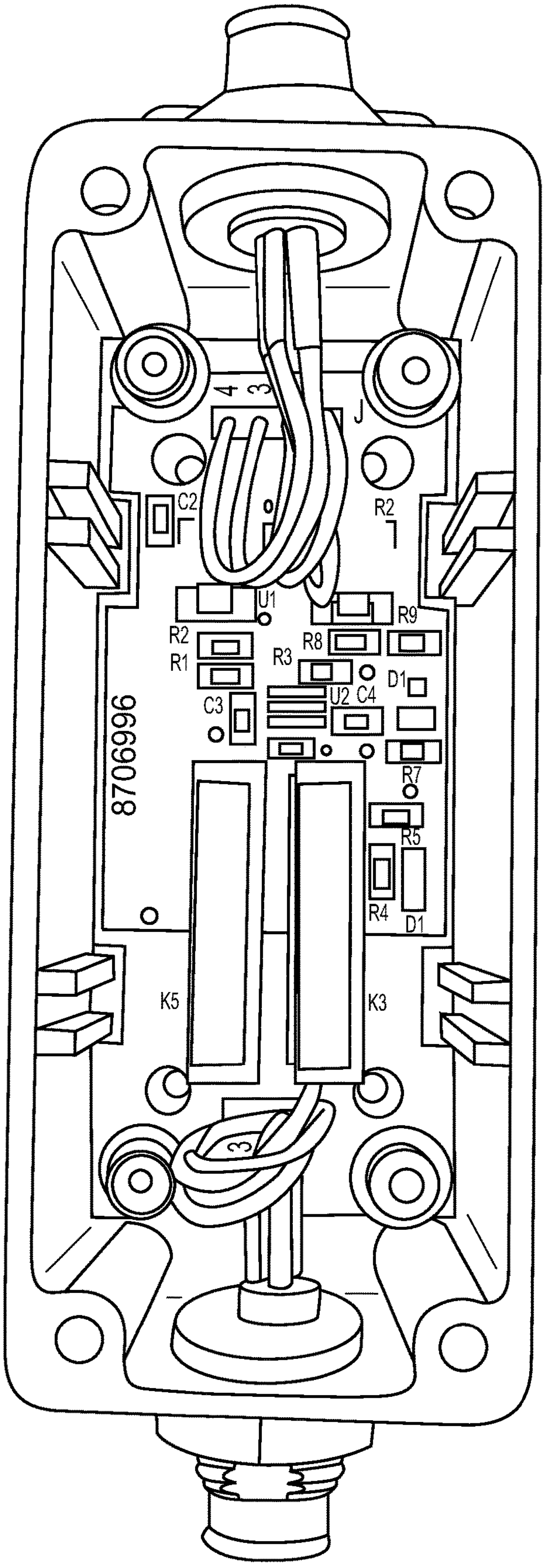
FIG. 4 shows an exemplary timing delay printed circuit board within a metal housing.

FIG. 4 shows an exemplary timing delay printed circuit board within a metal housing with the first and second connectors.

Figure 5:
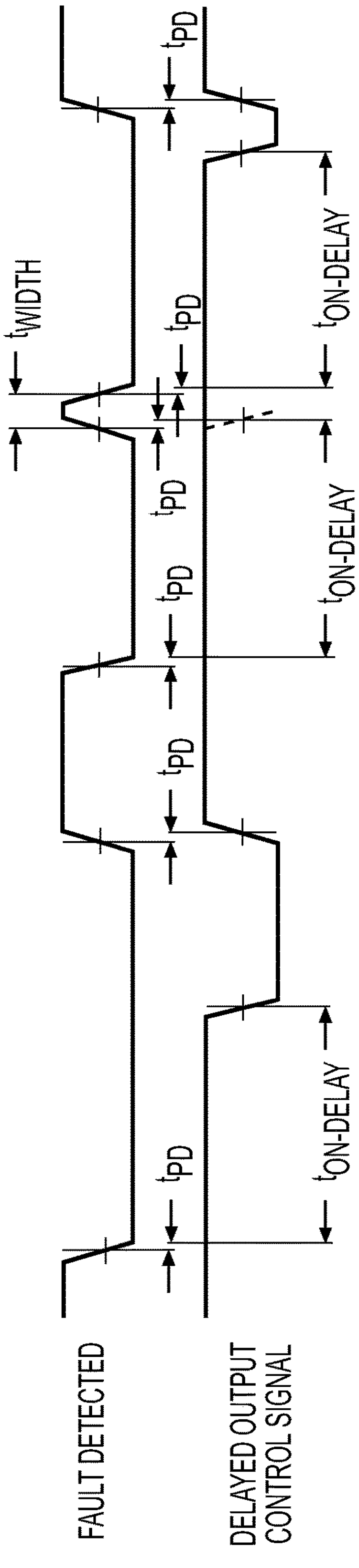
FIG. 5 shows a timing diagram of falling edge delay circuit.

FIG. 5 shows a timing diagram of falling edge delay circuit. When the Fault Detected signal transitions low, on a falling edge, the Delayed Output ($t_{on-delay}$) will follow after a short propagation delay $t_{PD}$ at U2 pin 6. It takes approximately 10 ns for U2 to respond to the input signal at US pin 1. If the Fault Detected signal remains low long enough for Delayed Output to follow, the timing will restart on the next transition.

Although the invention has been described in detail with reference to certain preferred embodiments, variations and modifications exist within the spirit and scope of the invention as described and defined in the following claims.

The invention claimed is:

1. A fault signal system comprising:

a timing delay circuit;

at least one delay circuit relay;

a first and a second connection point; and a switch relay;

wherein the first connection point is configured to connect to a device under test;

wherein the at least one delay circuit relay forms a closed delay circuit when the device under test experiences a fault;

wherein a default signal is provided to the switch relay when the delay circuit relay is open;

wherein a delay signal is provided to the second connection point when the delay circuit relay closes.

2. The system of claim 1, further comprising a first and a second display section, wherein the first and second display sections are coupled to the switch relay.

3. The system of claim 2, wherein the first display section comprises a green light emitting diode (LED) and the second display section comprises a red LED.

4. The system of claim 1, the timing delay circuit comprising a delay extender circuit comprising a delay resistor, wherein the resistance of the delay resistor determines the duration the delay circuit remains active.

* * * * *